(12) United States Patent
Belforte et al.

(10) Patent No.: US 6,320,390 B1
(45) Date of Patent: Nov. 20, 2001

(54) PROBE FOR FAULT ACTUATION DEVICES

(75) Inventors: Piero Belforte; Flavio Maggioni, both of Turin (IT)

(73) Assignee: Cselt-Centro Studi e Laboratori Telecomunicazioni S.p.A., Turin (IT)

( * ) Notice: Subject to any disclaimer, the term of this patent is extended or adjusted under 35 U.S.C. 154(b) by 0 days.

(21) Appl. No.: 09/117,969

(22) PCT Filed: Mar. 5, 1997

(86) PCT No.: PCT/EP97/01096

§ 371 Date: Aug. 7, 1998

§ 102(e) Date: Aug. 7, 1998

(87) PCT Pub. No.: WO97/33180

PCT Pub. Date: Sep. 12, 1997

(30) Foreign Application Priority Data

Mar. 6, 1996 (IT) ................................. TO96A0168

(51) Int. Cl.[7] ........................................... G01R 31/14
(52) U.S. Cl. .......................... 324/511; 324/527; 324/531; 324/754

(58) Field of Search ..................................... 324/500, 511, 324/527, 531, 537, 754, 149

(56) References Cited

U.S. PATENT DOCUMENTS

| 4,309,657 | * | 1/1982 | Lockhart, Jr. et al. ............... 324/537 |
| 4,489,247 |   | 12/1984 | Ikeda et al. ........................... 307/477 |
| 4,841,240 | * | 6/1989 | Hsue et al. ............................ 324/754 |

FOREIGN PATENT DOCUMENTS

| 23 63 360 | 6/1975 | (DE) . |
| 0 262 367 | 4/1988 | (EP) . |
| 62 183215 | 8/1987 | (JP) . |

* cited by examiner

*Primary Examiner*—Glenn W. Brown
(74) *Attorney, Agent, or Firm*—Herbert Dubno

(57) ABSTRACT

A probe for fault-actuation devices has a transistor which is utilized to insert a reference signal into a fault-insertion point. The emitter and collector are connectable to the fault-insertion point and a reference signal and a capacitor with a capacitance greater than the capacitance of parasitic components is connected between the base and the emitter.

12 Claims, 3 Drawing Sheets

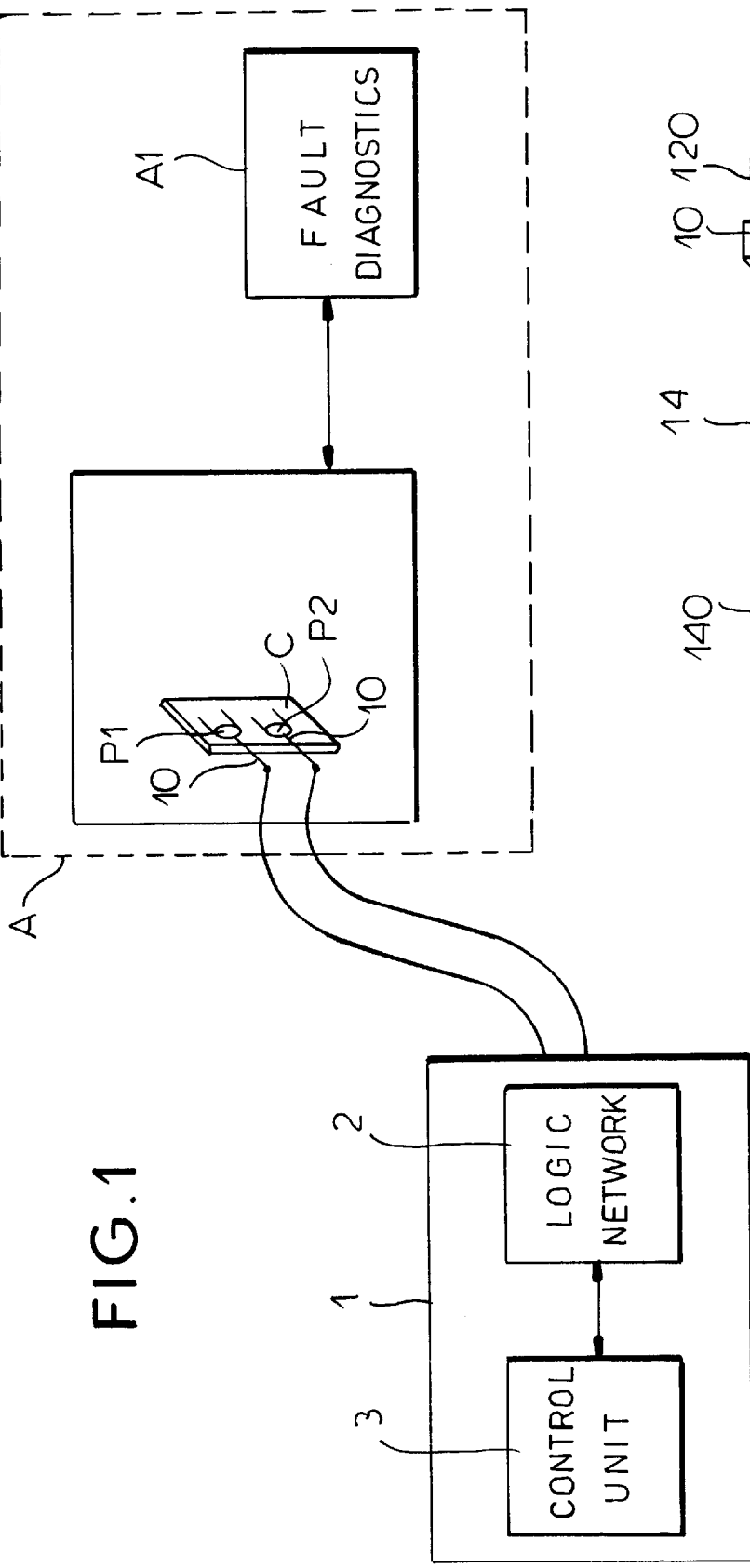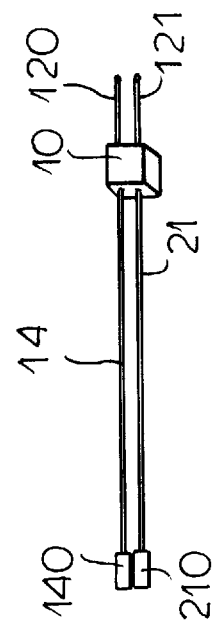

PROBE FOR FAULT ACTUATION DEVICES

CROSS REFERENCE TO RELATED APPLICATIONS

This application is a national stage of PCT/EP 97/01096 filed Mar. 5, 1997 and based upon Italian National application To 96A 000168 filed Mar. 6, 1996 under the International Convention.

FIELD OF THE INVENTION

The present invention relates in general to the so-called fault actuation or insertion techniques used to test the operation of electronic equipment, and concerns a probe or fault actuation devices, arranged to force a test point of an electronic equipment under test to a given signal level, the probe comprising: a transistor having a control electrode and two circuit terminals, which circuit terminals are connected respectively to the test point and to a given signal level, and control means acting on the control electrode of the transistor to selectively switch the transistor between a cut-off condition and a conducting condition.

BACKGROUND OF THE INVENTION

A probe with some similarity to the above probe is known from EP A 0 261 367. The probe is a mechanical probe which is brought into electrical contact with a test point of an electronic component and an alternating square wave test signal is applied to the test point through a transistor and extracted through a circuit connected to the probe. The transistor which is a field effect transistor applies to the test point the mentioned variable signal, so as to simulate regular operation conditions of the component. Parasitic capacitances within the transistor are likely to introduce some distortion into the amplified square-wave voltage.

In electronic equipment and systems (especially if very complex: by way of nonlimiting example, reference can be made to switching exchanges of telecommunications networks), the need often arises to check the behavior of the equipment and of the system in the presence of particular fault conditions. This check can be carried out not only in the testing phase, but it may be a part of the fault diagnosis and/or identification or of automatic reconfiguration functions which often are provided for in such equipment and systems to ensure that the equipment can still operate (at least in part) even in the presence of faults.

In digital equipment, the types of faults to be actuated or inserted (hereafter the terms "actuation" and "insertion" shall be used as synonyms) at the hardware level generally entail forcing certain points of the equipment to a pre-set signal level, corresponding for example to a logic "0" or to a logic "1". A solution conventionally adopted in the art has thus been to establish, in correspondence with the point to be forced to the pre-set signal level, an electrical connection (usually by means of a jumper) towards the ground level or a given power supply level ($+V_{cc}$ or $-V_{cc}$).

This solution is not particularly easy to be put in practice, also in view of its intrinsically "fixed" nature, once the jumper has been applied, the point involved is constantly maintained at the signal level to which the jumper is connected. Hence, it is not possible to monitor quickly the reaction of the equipment at the moment the fault is inserted and/or, which can be of no less interest, at the moment the fault is eliminated.

To overcome these drawbacks, a solution has been proposed, at least at the experimental level, which entails connecting electrical conductors, coming out of the equipment under test, to the fault insertion points. Such conductors lead to a set of electromechanical switches (such as, typically, relays) which allow the required connections to the reference voltages to be established.

This solution cannot be considered fully satisfactory, for several reasons.

Firstly, it is intrinsically cumbersome. Additionally, the conductors connected to the fault insertion points always disturb the equipment being tested. Thus, the fault conditions simulated for the test do not exactly correspond, from the electrical point of view, to the fault conditions likely to occur in the equipment (this is particularly true when current absorption at the fault point is also to be measured). Further, the conductors disturb the operation of the equipment even under regular service conditions, i.e. when there is no fault actuation.

OBJECTS OF THE INVENTION

It is, therefore, an object of the invention to provide a system capable of overcoming the problems set out above and, in particularly, which:

makes reproducing fault conditions very flexible, in order to allow a substantially instantaneous switching from the normal operating condition to the simulated fault condition of the equipment under test;

does not disturb the operation of the equipment both when a fault is being simulated and under normal operating conditions of equipment, with no faults applied;

is intrinsically not cumbersome, in order to allow simultaneous or nearly simultaneous fault insertion into a number of points of an equipment under test, for instance points belonging to a board inserted in a cabinet, according to a typical constructive embodiment of complex electronic equipment; and allows automating testing operations.

Additionally, it should also be noted that the devices required, at least as concerns the components (probes) directly used for connection to the equipment under test, should have a negligible cost. Thus they can be left in place once the test has been completed, that is, they can be single-use products.

SUMMARY OF THE INVENTION

According to the present invention, this goal is reached with a device characterized in that in its conducting condition, the transistor in use is driven into saturation condition causing the test point to be forced to said given signal level. A capacitor is directly connected between the control electrode and the circuit terminal of the transistor opposite to that point, which capacitor has a substantially higher capacitance value than the value of the parasitic capacitance existing between control terminal and the circuit terminal of the transistor coupled to the test point.

From DE-B 23 63 360, it is known, per se, that in an amplifier, a series connection of a capacitor and a resistor is coupled between the base and the emitter of the amplifier transistor. The resistor is a part of a voltage divider. The transistor used as an amplifier operates in a linear zone of its characteristics in order to provide an output signal proportional to the input signal. The known circuit arrangement, thus does not give any hint to the person in the art to arrange the probe for fault actuation in the manner proposed by the invention.

Within the concept of the invention, the construction details may be changed widely with respect to what will be termed a transistor, working as an electronic switch. The "transistor" may be any electronic component with equivalent operating characteristics. The term "transistor" thus is to be taken to include such equivalent electronic devices as well; this also holds true for the terms "collector", "emitter" and "base", identifying the terminals of a bipolar transistor.

BRIEF DESCRIPTION OF THE DRAWING

The above and other objects, features, and advantages will become more readily apparent from the following description, reference being made to the accompanying drawing in which:

FIG. 1 depicts, as a general block diagram, the typical configuration of a fault actuation device, in conjunction with equipment tests by using such a system;

FIG. 6 represents an example of practical construction of a probe according to the invention.

SPECIFIC DESCRIPTION

Figure 3:
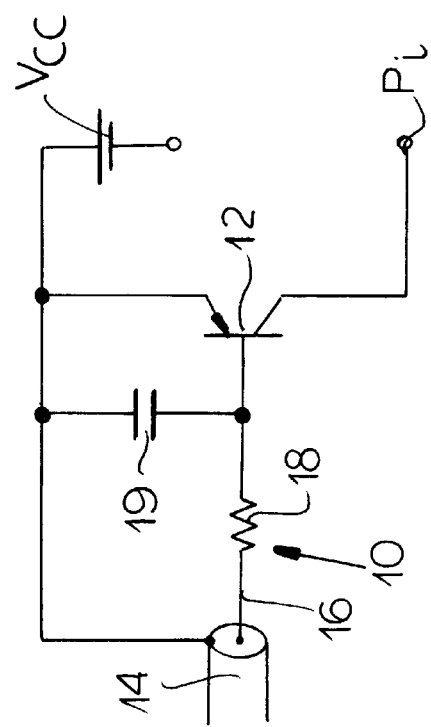
FIGS. 2 through 5 show circuit diagrams of four different embodiments of a probe for fault actuation devices according to the invention.

In FIG. 1, A denotes the whole of an electronic equipment to be tested according to typical fault insertion procedures. By way of non-limiting example, equipment A could be a digital switching exchange of a telecommunications system or a part of that exchange (for instance the set of circuits located on a board C). In the same Figure, references P1, P2 indicate, by way of example, two points of board C where a fault is to be inserted. Of course any number of points throughout the equipment can be involved, depending on the application requirements. As it has already been stated, inserting a fault entails, in practice, forcing the point involved (hereafter generally indicated as Pi) to a preset signal level, for instance 0 V (ground voltage) or±5V (i.e. $V_{cc}$ power supply voltage). The signal levels indicated usually correspond, in digital equipment, to logic levels "0" and "1".

Equipment A is usually associated with a system A1 (forming an integral part of the equipment) for identifying/diagnosing faults and/or for reconfiguring equipment A to make it resistance to the onset of particular faults. The features of such a system are known in themselves to those skilled in the art, and they do not require to be illustrated specifically herein, since they are not of interest for the understanding of the invention.

As previously indicated, the invention specifically faces the problem of inserting a fault into a specific point Pi, regardless of the reaction induced by the fault insertion into equipment A and of the monitoring of that reaction.

Fault insertion into point Pi is accomplished by a device 1 comprising one or more probes 10 (possibly of the single-use type) which form the specific subject matter of the present invention. In practice, device 1 may comprise, for instance, a more or less complex logic network 2 arranged to supply probes (10) associated therewith with command signals aimed at causing the operation of each probe in ways that will be better described further on. The probes can be temporarily or permanently connected to points Pi. In a preferred embodiment, network 2 is controlled by a control unit 3 comprising an electronic processor which causes fault insertion into the different points according to a desired schedule and which possibly is also capable of dialoguing with system A1 to coordinate fault actuation with the monitoring of the behavior of system A1 and equipment A.

Figure 5:
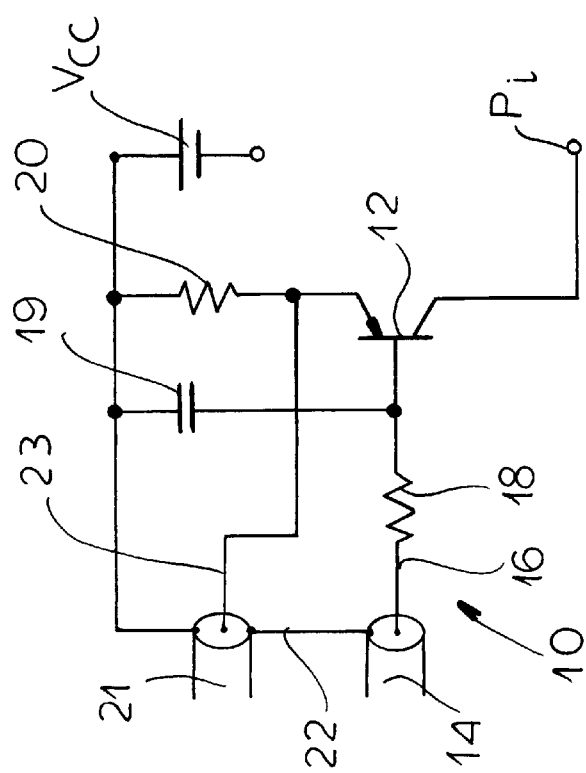
Figure 4:
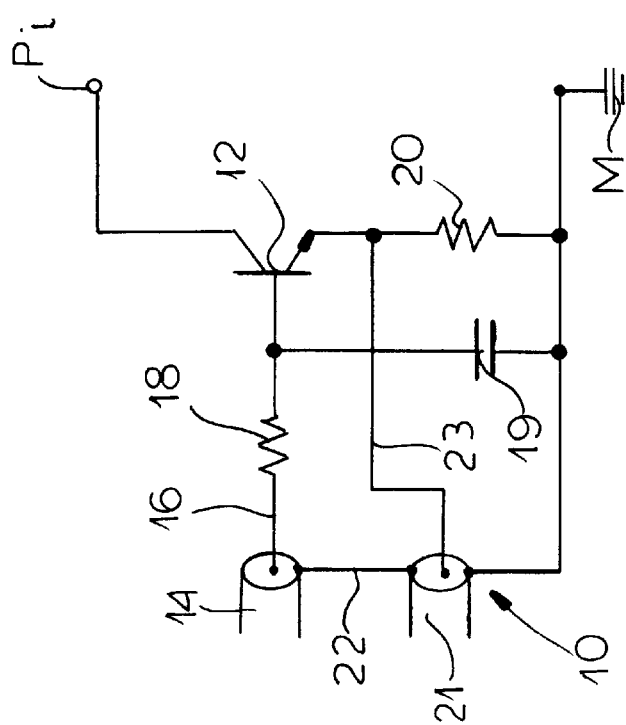

In the exemplary embodiments shown in FIGS. 4 and 5, each probe is also associated with a feedback unit able to send back towards device 1 a signal indicating current absorption in correspondence with fault insertion point Pi. This indication can be particularly interesting in those situations where the fault brings about an anomalous stress (for instance, a short-circuit load) on a unit like a driver, so that it is important to determine the intensity of the overload, in terms of delivered current, applied to that driver as an effect of the fault.

Figure 2:
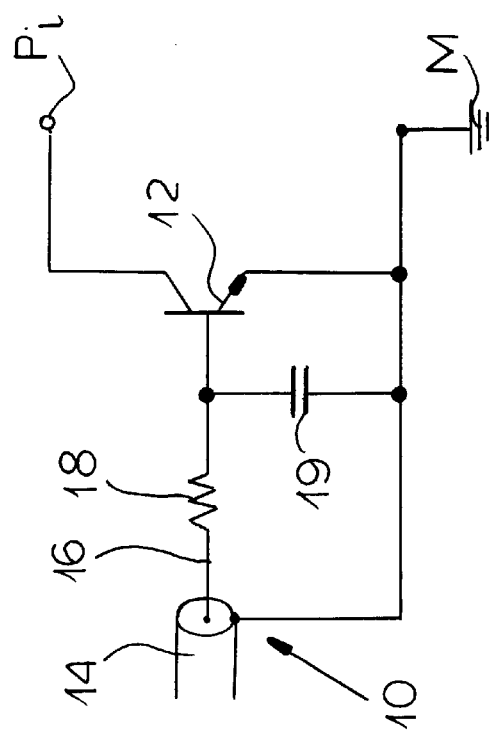

In all embodiments depicted in FIGS. 2 to 5, the basic component of probe 10 is a transistor 12, which preferably is an n-p-n bipolar transistor in the solutions shown in FIGS. 2 and 4 (relating to a probe which allows forcing the respective point Pi to ground voltage M) and is a p-n-p bipolar transistor in the solutions shown in FIGS. 3 and 5 (relating to a probe which allows forcing the respective fault point Pi to a fixed, positive reference+$V_{cc}$).

In practice, in all embodiments shown, the collector of transistor 12 corresponds to the terminal of probe 10 meant to be permanently or temporarily connected to the fault insertion point Pi. The emitter of transistor 12, on the other hand, corresponds to the terminal of the probe meant to be connected also permanently or temporarily, to the pre-set signal level. The same connection configuration can also be adopted for ECL logic circuits, operating between 0V (ground M) and–5 V(–$V_{cc}$), by connecting the emitter of transistor 12 to voltage–$V_{cc}$ (FIGS. 2 and 4) and to ground voltage M (FIGS. 3 and 5), respectively. In more general terms, the solutions using n-p-n transistor (FIGS. 2 and 4) allow forcing point Pi, connected to the transfer collector, to the lower one of the reference voltage levels, i.e. M (typically 0 Volts) or–$V_{cc}$ (e.g.–5V). The solution with p-n-p transistor (FIGS. 3 and 5) allows instead to force point Pi to the higher reference voltage level, i.e.+$V_{cc}$ or M, respectively.

In the diagrams of FIGS. 2 and 3, probe 10 is connected to control device 1 for instance by means of a coaxial cable of which shield 14 is connected to the reference voltage (ground M or power supply voltage±$V_{cc}$) and hence to the emitter of transistor 12, an internal conductor 16 is connected to the base of transistor 12 through a bias resistor 18 whose resistance is, for example, of the order of 100 ohm.

By the arrangement described, when transistor 12 is in cut-off condition the emitter and collector terminals can be seen as electrically insulated from each other, so that probe 10, even if it is connected to the fault insertion point (Pi), actually has no impact on equipment A (except for the considerations that follow). The manner for obtaining the cut-off condition are well know. When transistor 12 is brought to a saturation condition—in an equally known manner—the transistor will behave as a short circuit between the collector and emitter terminals. Point Pi is actually connected to ground level (FIGS. 2 and 4) or to power supply voltage $V_{cc}$ (FIGS. 3 and 5). Under these conditions, the required fault insertion is accomplished.

The solutions shown in FIGS. 4 and 5 differ from the solutions shown in FIGS. 2 and 3, because of the presence of a resistor 20 whose resistance is, for example of the order of one Ohm. Resistor 20 is preferably connected in series with the emitter of transistor 12. Thus the current flowing in transistor 12 (between collector and emitter) when transistor 12 is in saturation condition, i.e. when the failure insertion is being performed, passes through resistor 20. The voltage across resistor 20 is a signal representative of the value of that current, which signal can be sent back towards device 1 through a feedback line, also comprising for example a coaxial cable with a shield 21 (usually connected electrically via 22 to shield 14 of the cable driving the base of transistor 12) and an internal conductor 23 connected to the emitter of transistor 12. As a consequence, cable 21, 23 carries a signal which is representative of current absorption in correspondence with fault insertion point Pi, thus allowing indications to be obtained on the electrical load induced on equipment A by the fault insertion.

The behavior just described in order to illustrate the general operating principles of probe 10 according to the invention constitutes an ideal model which fails to take into account the presence of the parasitic capacitance ($C_{CB}$) between collector and base of transistor 12. Due to the existence of that capacitance whose value is of the order of one picofarad (pF), the presence of probe 10 connected to point Pi is not fully without influence, particularly when fault insertion is not being performed.

To understand this, reference is made to the diagram in FIG. 2 (the situation is identical for the diagram in FIG. 4 and complementary for the diagrams in FIGS. 3 and 5).

Under normal operating conditions of the equipment, i.e. when fault insertion is not being performed, the level of point Pi varies depending on the behavior of the signals which are present at that point (generally, binary signals). By way of example, point Pi will switch between ground level M (logic "0") and level $V_{cc}$ (logic "1"). In correspondence with the rising edges of the signal present on point Pi, the parasitic capacitance present between the collector and the base of transistor 12 tends to create such an electrical coupling between those terminals as to bring, at least for a brief instant, the base of transistor 12 to a level sufficient to make the base-emitter junction conduct. Consequently, there is a current flow through the collector and the emitter of transistor 12 itself. This results, in practice, into a rather "distorted" rising edge, that is voltage on point Pi does not grow steeply (step voltage) but rather with a more or less rounded edge influenced by the conduction phase induced into transistor 12.

The behavior 12 in the case of FIG. 4 is wholly similar. In the solutions depicted in FIGS. 3 and 5, on the other hand, a similar phenomenon affects the falling edges. In this case as well, the parasitic capacitive coupling between the collector and the base of transistor 12 is such as to make, at least for a brief interval, the emitter-base junction conduct. Thus transistor 12, at least temporarily, conducts and thus, again, "distorts" the aforesaid falling edges.

To obviate the aforesaid drawback, according to the invention a capacitor 19 is directly connected between the base and the emitter of transistor 12, said capacitor having a capacitance value generally higher, preferably by at least two orders of magnitude (hence a capacitance, for example, of 100 pF) than the parasitic capacitance existing between the collector and the base.

As shown by Applicant's experiments, and as can also be ascertained analytically, the presence of capacitor 19 is such as to contrast (and, for practical purposes, to cancel out) the tracking of the collector of transistor 12 by the transistor base due to the parasitic capacitive-coupling existing between those terminals.

In practice, thanks to the presence of capacitor 19 (a choice that goes against the conventional design rules for transistor circuits), probe 10 does not appreciably disturb equipment A, while performing, very precisely and reliably, failure insertion at local level (thus avoiding the typical drawbacks of those solutions which entail a sort of "transfer" of point Pi to the outside through longer or shorter conductors).

The probe according to the invention is preferably manufactured as depicted schematically in FIG. 6.

The body of probe 10, comprising circuit elements 12, 18, 19 (and, in the case of the embodiment shown in FIGS. 4 and 5, resistor 20), is preferably made as a miniaturized circuit, for instance with SMD (Surface Mounting Device) technology. The probe body thus appears as a small container, usually dipped in resin, whose size is of the order of a few millimeters. Two terminals 120, 121, corresponding to the emitter and to the collector of transistor 12, come out from the container and are meant for connection to board C in the way described above.

FIG. 6 (which specifically refers to the embodiment depicted in FIGS. 4 and 5) shows the shields of two coaxial cables for connection to device 1 (FIG. 1), which cables are equipped with respective connectors 140, 210 at the end remote from the probe body. Obviously, in the embodiment shown in FIGS. 2 and 3 only one cable is present. Using coaxial connection cables is advantageous for the purpose of exactly maintaining the signal waveforms, especially with regard to absorbed current monitoring (resistor 20 and cable 21, 23).

What is claimed is:

1. A probe for fault actuation devices, arranged to force a test point of electronic equipment under test to a given signal level, the probe comprising a transistor having a control electrode and two circuit terminals which circuit terminals are connectable respectively to said test point and to said given signal level and means acting on the control electrode of the transistor for selectively switching the transistor between a cutoff condition and a conducting condition, the transistor in conducting condition being driven into saturation, causing said test point to be forced to said given signal level and a capacitor directly connected between the control electrode and a circuit terminal of the transistor opposite to said test point, which capacitor has substantially higher capacitance value than a value of parasitic capacitance existing between the control electrode and the circuit terminal of the transistor coupled to the test point.

2. The probe defined in claim 1 wherein the capacitance of said capacitor is higher by about two orders of magnitudes than said parasitic capacitance.

3. The probe defined in claim 2 wherein the capacitance of said capacitor is of the order of about 100 picofarad.

4. The probe defined in claim 1 wherein said transistor is a bipolar transistor having a collector connected to said point and an emitter coupled to the given signal level.

5. The probe defined in claim 4 wherein said transistor is an n-p-n transistor and said probe is arranged to force said test point to a minimum signal level.

6. The probe defined in claim 4 wherein said transistor is a p-n-p transistor and said probe is arranged to force said point to a maximum signal level.

7. The probe defined in claim 4 wherein the circuit terminal of the transistor which is coupled to the given signal level is coupled to the transistor via a resistor across which, when the transistor is in saturation, a voltage is present which is representative of current absorption in correspondence with said point when the point is forced to said given signal level.

8. The probe defined in claim 7 wherein said resistor is associated with at least one coaxial cable to convey a signal representative of said current absorption to the fault actuation device.

9. The probe defined in claim 4 manufactured as a miniaturized circuit.

10. The probe defined in claim 9 in the form of an SMD circuit.

11. The probe defined in claim 9 which comprises protruding conducting terminals corresponding to the circuit terminals of said transistor.

12. The probe defined in claim 4 wherein said means acting on the central electrode of the transister comprise at least one coaxial connection cable.

* * * * *